US010340185B2

(12) United States Patent
Golonzka et al.

(10) Patent No.: US 10,340,185 B2
(45) Date of Patent: Jul. 2, 2019

(54) GATE ALIGNED CONTACT AND METHOD TO FABRICATE SAME

(71) Applicant: Intel Corporation, Santa Clara, CA (US)

(72) Inventors: Oleg Golonzka, Beaverton, OR (US); Swaminathan Sivakumar, Beaverton, OR (US); Charles H. Wallace, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/624,036

(22) Filed: Jun. 15, 2017

(65) Prior Publication Data

US 2017/0294350 A1 Oct. 12, 2017

Related U.S. Application Data

(63) Continuation of application No. 13/995,678, filed as application No. PCT/US2011/066989 on Dec. 22, 2011, now Pat. No. 9,716,037.

(51) Int. Cl.
*H01L 21/70* (2006.01)
*H01L 21/768* (2006.01)
(Continued)

(52) U.S. Cl.
CPC .. *H01L 21/76897* (2013.01); *H01L 21/28008* (2013.01); *H01L 21/30625* (2013.01);
(Continued)

(58) Field of Classification Search
CPC .................................................. H01L 21/76897
(Continued)

(56) References Cited

U.S. PATENT DOCUMENTS 6,222,217 B1 4/2001 Kunikiyo
6,451,708 B1 9/2002 Ha
(Continued)

FOREIGN PATENT DOCUMENTS

CN 1255236 5/2000
CN 101834206 9/2010
(Continued)

OTHER PUBLICATIONS

Notice of Allowance from Taiwan Patent Application No. 101144710, dated Jun. 4, 2015, 3 pages (Including English Translation).
(Continued)

*Primary Examiner* — Caleb E Henry
(74) *Attorney, Agent, or Firm* — Schwabe, Williamson & Wyatt, P.C.

(57) ABSTRACT

Gate aligned contacts and methods of forming gate aligned contacts are described. For example, a method of fabricating a semiconductor structure includes forming a plurality of gate structures above an active region formed above a substrate. The gate structures each include a gate dielectric layer, a gate electrode, and sidewall spacers. A plurality of contact plugs is formed, each contact plug formed directly between the sidewall spacers of two adjacent gate structures of the plurality of gate structures. A plurality of contacts is formed, each contact formed directly between the sidewall spacers of two adjacent gate structures of the plurality of gate structures. The plurality of contacts and the plurality of gate structures are formed subsequent to forming the plurality of contact plugs.

20 Claims, 8 Drawing Sheets

(51) Int. Cl.

| | |
|---|---|
| ***H01L 21/306*** | (2006.01) |
| ***H01L 27/088*** | (2006.01) |
| ***H01L 29/66*** | (2006.01) |
| ***H01L 21/28*** | (2006.01) |
| ***H01L 21/8234*** | (2006.01) |
| ***H01L 27/02*** | (2006.01) |
| ***H01L 23/535*** | (2006.01) |
| ***H01L 29/06*** | (2006.01) |
| *H01L 21/32* | (2006.01) |

(52) U.S. Cl.

CPC .................. *H01L 21/76805* (2013.01); *H01L 21/823431* (2013.01); *H01L 21/823437* (2013.01); *H01L 21/823468* (2013.01); *H01L 21/823475* (2013.01); *H01L 21/823481* (2013.01); *H01L 23/535* (2013.01); *H01L 27/0207* (2013.01); *H01L 27/088* (2013.01); *H01L 27/0886* (2013.01); *H01L 29/0653* (2013.01); *H01L 29/66545* (2013.01); *H01L 21/32* (2013.01)

(58) Field of Classification Search

USPC .......................................................... 257/368

See application file for complete search history.

(56) References Cited

U.S. PATENT DOCUMENTS

| | | | | |
|---|---|---|---|---|
| 6,528,418 | B1 | 3/2003 | Kim et al. | |
| 6,580,137 | B2 * | 6/2003 | Parke | H01L 21/84 257/401 |
| 7,598,142 | B2 * | 10/2009 | Ranade | H01L 21/76897 257/351 |
| 8,367,509 | B1 * | 2/2013 | Jang | H01L 21/76897 257/E21.632 |
| 8,896,068 | B2 * | 11/2014 | Mayuzumi | H01L 21/28518 257/369 |
| 2001/0055842 | A1 | 12/2001 | Uh et al. | |
| 2001/0055867 | A1 | 12/2001 | Lee | |
| 2002/0001889 | A1 | 1/2002 | Kim et al. | |
| 2002/0001931 | A1 | 1/2002 | Kim et al. | |
| 2002/0055222 | A1 | 5/2002 | Kim et al. | |
| 2003/0096501 | A1 | 5/2003 | Ootsuka et al. | |
| 2005/0085072 | A1 | 4/2005 | Kim et al. | |
| 2005/0095793 | A1 | 5/2005 | Lee | |
| 2005/0098850 | A1 | 5/2005 | Kim et al. | |
| 2005/0167758 | A1 | 8/2005 | Ahn et al. | |
| 2005/0176225 | A1 | 8/2005 | Lee et al. | |
| 2005/0191813 | A1 | 9/2005 | Seo et al. | |
| 2006/0091454 | A1 | 5/2006 | Uchiyama | |
| 2007/0072407 | A1 | 3/2007 | Kim et al. | |
| 2007/0082492 | A1 | 4/2007 | Kim et al. | |
| 2007/0126053 | A1 | 6/2007 | Lee | |
| 2007/0141799 | A1 | 6/2007 | Olligs et al. | |
| 2008/0073708 | A1 | 3/2008 | Aiso | |
| 2008/0254608 | A1 * | 10/2008 | Seo | H01L 21/76897 438/596 |
| 2009/0194825 | A1 * | 8/2009 | Werner | H01L 21/28123 257/397 |
| 2009/0289334 | A1 | 11/2009 | Rachmady et al. | |
| 2010/0001340 | A1 | 1/2010 | Lee et al. | |
| 2010/0164051 | A1 | 7/2010 | Chae et al. | |
| 2012/0025317 | A1 * | 2/2012 | Zhong | H01L 21/76897 257/368 |
| 2012/0139062 | A1 * | 6/2012 | Yuan | H01L 21/76897 257/411 |
| 2012/0211808 | A1 * | 8/2012 | Wei | H01L 21/823412 257/288 |
| 2013/0075821 | A1 * | 3/2013 | Baars | H01L 29/66545 257/368 |
| 2013/0320456 | A1 * | 12/2013 | Golonzka | H01L 29/66545 257/368 |
| 2015/0008524 | A1 * | 1/2015 | Hung | H01L 27/088 257/368 |

FOREIGN PATENT DOCUMENTS

| | | |
|---|---|---|
| CN | 102013424 | 4/2011 |
| JP | 2008-288272 | 11/2008 |
| KR | 102007005898 | 11/2007 |
| KR | 102011006930 | 6/2011 |

OTHER PUBLICATIONS

Notice of Allowance for Korean Patent Application No. 10-2014-7016870, dated Jan. 7, 2016, 2 pages.

Notice of Allowance for Chinese Patent Application No. 201180075764.1, dated Jul. 7, 2016, 4 pages. (Including English Translation).

Office Action for Korean Patent Application No. 10-2016-7009148, dated Jul. 1, 2017, 6 pages. (Including English Translation).

Notice of Allowance for Korean Patent Application No. 10-2016-7009148, dated Aug. 17, 2017, 2 pages.

Office Action for Korean Patent Application No. 10-2017-7033591, dated Jan. 12, 2018, 5 pages. (Including English Translation).

International Search Report and Written Opinion for PCT Patent Application No. PCT/US2011/066989 dated Aug. 17, 2012, 9 pgs.

International Preliminary Report on Patentability from PCT/US2011/066989 dated Jul. 3, 2014, 6 pgs.

Office Action and Search Report for Chinese Patent Application No. 201180075764.1, dated Dec. 8, 2015, 19 pgs.

Office Action and Search Report for Korean Patent Application No. 10-2014-7016870, dated Jul. 17, 2015, 5 pgs.

Office Action and Search Report for Taiwanese Patent Application No. 101144710, dated Jul. 28, 2014, 4 pgs.

Notice of Preliminary Rejection for Korean Patent Application No. 10-2016-7009148 dated Jan. 18, 2017, 6 pgs.

Final Office Action from U.S. Appl. No. 13/995,678 dated Jul. 25, 2016, 12 pgs.

Non-Final Office Action from U.S. Appl. No. 13/995,678 dated Feb. 8, 2016, 12 pgs.

Non-Final Office Action from U.S. Appl. No. 13/995,678 dated Mar. 26, 2015, 11 pgs.

Final Office Action from U.S. Appl. No. 13/995,678 dated Oct. 9, 2015, 12 pgs.

Non-Final Office Action from U.S. Appl. No. 13/995,678 dated Dec. 1, 2016, 15 pgs.

Office Action from Korean Patent Application No. 10-2018-7026464, dated Oct. 25, 2018, 16 pgs.

Office Action from Korean Patent Application No. 10-2018-7026464, dated Mar. 12, 2019, 4 pages.

Office Action from Chinese Patent Application No. 201610305963.1, dated Apr. 2, 2019, 4 pgs.

Office Action from Korean Patent Application No. 10-2017-7033591, dated Apr. 17, 2019, 6 pg.

* cited by examiner

GATE ALIGNED CONTACT AND METHOD TO FABRICATE SAME

CROSS-REFERENCE TO RELATED APPLICATIONS

This application is a continuation of U.S. patent application Ser. No. 13/995,678, filed on Jun. 19, 2013, which is a U.S. National Phase application under 35 U.S.C. § 371 of International Application No. PCT/US2011/066989, filed Dec. 22, 2011, entitled "GATE ALIGNED CONTACT AND METHOD TO FABRICATE SAME," the entire contents of which are incorporated herein by reference.

TECHNICAL FIELD

Embodiments of the invention are in the field of semiconductor devices and processing and, in particular, gate aligned contacts and methods of forming gate aligned contacts.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

SUMMARY

Embodiments of the present invention include gate aligned contacts and methods of forming gate aligned contacts.

In an embodiment, a semiconductor structure includes a plurality of gate structures disposed above a top surface of, and along sidewalls of, a three-dimensional active region disposed above a substrate. The gate structures each include a gate dielectric layer, a gate electrode, and sidewall spacers.

A plurality of contacts is included, each contact disposed directly between the sidewall spacers of two adjacent gate structures of the plurality of gate structures. A plurality of contact plugs is also included, each contact plug disposed directly between the sidewall spacers of two adjacent gate structures of the plurality of gate structures.

In another embodiment, a method of fabricating a semiconductor structure includes forming a plurality of gate structures above an active region formed above a substrate. The gate structures each include a gate dielectric layer, a gate electrode, and sidewall spacers. A plurality of contact plugs is formed, each contact plug formed directly between the sidewall spacers of two adjacent gate structures of the plurality of gate structures. A plurality of contacts is formed, each contact formed directly between the sidewall spacers of two adjacent gate structures of the plurality of gate structures. The plurality of contacts and the plurality of gate structures are formed subsequent to forming the plurality of contact plugs.

In another embodiment, a method of fabricating a semiconductor structure includes forming a gate line grating above a substrate. The gate line grating includes a plurality of dummy gate lines. A masking stack is formed above and between the dummy gate lines of the gate line grating. A patterned hardmask layer is formed from the masking stack above and between only a first portion of the dummy gate lines of the gate line grating, exposing a second portion of the dummy gate lines. A dielectric layer is formed above the patterned hardmask layer and above and between the second portion of the dummy gate lines. The dielectric layer is planarized to form a patterned dielectric layer above and between the second portion of the dummy gate lines, and to re-expose the patterned hardmask layer. The patterned hardmask layer is removed from the first portion of the dummy gate lines of the gate line grating, re-exposing the first portion of the dummy gate lines. An interlayer dielectric layer is formed above the patterned dielectric layer, and above and between the first portion of the dummy gate lines. The interlayer dielectric layer and the patterned dielectric layer are planarized to, respectively, form a first permanent interlayer dielectric portion between but not above the first portion of the dummy gate lines, and form a sacrificial dielectric portion between but not above the second portion of the dummy gate lines. One or more of the dummy gate lines of the first or second portions, or both, of the dummy gate lines is patterned to provide trench regions among a plurality of dummy gates and among remaining regions of the first permanent interlayer dielectric portion and the sacrificial dielectric portion. The trench regions are filled with a second permanent interlayer dielectric portion. The plurality of dummy gates is replaced with permanent gate structures. The remaining region of the sacrificial dielectric portion is removed to provide contact openings. Contacts are then formed in the contact openings.

BRIEF DESCRIPTION OF THE DRAWINGS

FIGS. 1A-1K illustrate cross-sectional views representing various operations in a method of fabricating a semiconductor structure having gate aligned contacts, in accordance with an embodiment of the present invention, with:

FIG. 1A illustrating a gate line grating formed above a substrate, the gate line grating including a plurality of dummy gate lines;

FIG. 1B illustrating a masking stack formed above and between the dummy gate lines of the gate line grating of FIG. 1A;

FIG. 1C illustrating a patterned hardmask layer formed from the masking stack of FIG. 1B, the patterned hardmask layer formed above and between only a first portion of the dummy gate lines of the gate line grating, exposing a second portion of the dummy gate lines;

FIG. 1D illustrating a dielectric layer formed above the patterned hardmask layer of FIG. 1C and above and between the second portion of the dummy gate lines;

FIG. 1E illustrating the dielectric layer of FIG. 1D planarized to form a patterned dielectric layer above and between the second portion of the dummy gate lines, and to re-expose the patterned hardmask layer;

FIG. 1F illustrating the patterned hardmask layer of FIG. 1E removed from the first portion of the dummy gate lines of the gate line grating, re-exposing the first portion of the dummy gate lines;

FIG. 1G illustrating an interlayer dielectric layer formed above the patterned dielectric layer, and formed above and between the first portion of the dummy gate lines;

FIG. 1H illustrating the interlayer dielectric layer and the patterned dielectric layer planarized to, respectively, form a first permanent interlayer dielectric portion between but not above the first portion of the dummy gate lines, and form a sacrificial dielectric portion between but not above the second portion of the dummy gate lines;

FIG. 1I illustrating one or more of the dummy gate lines of the first or second portions, or both, of the dummy gate lines of FIG. 1H patterned to provide trench regions among a plurality of dummy gates and among remaining regions of the first permanent interlayer dielectric portion and the sacrificial dielectric portion, the trench regions filled with a second permanent interlayer dielectric portion;

FIG. 1J illustrating the plurality of dummy gates of FIG. 1I replaced with permanent gate structures; and FIG. 1K illustrating the remaining region of the sacrificial dielectric portion removed to provide contact openings.

DETAILED DESCRIPTION

Figure 1A:
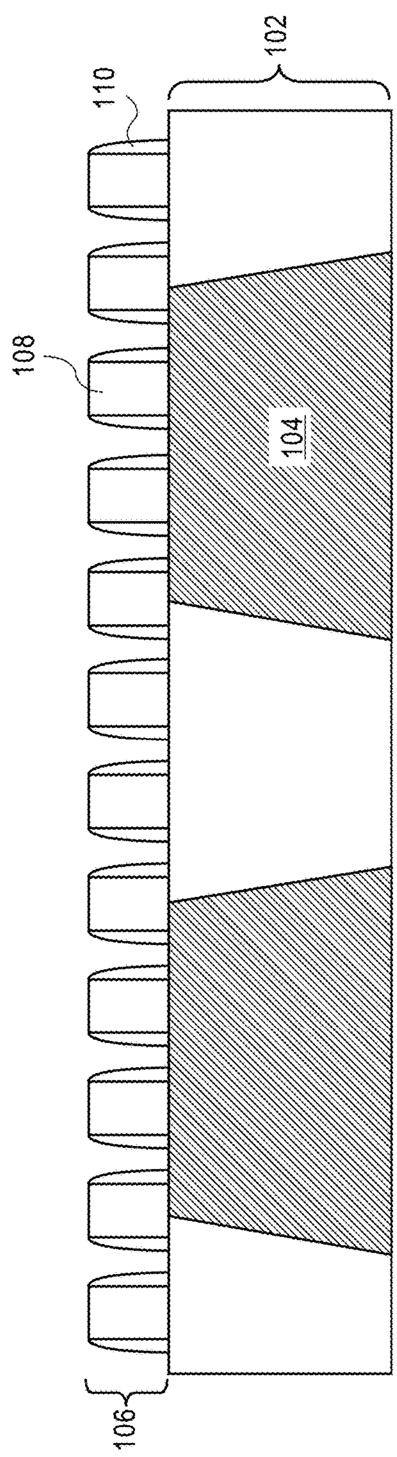

Gate aligned contacts and methods of forming gate aligned contacts are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to a gate aligned contact process. Such a process may be implemented to form contact structures for semiconductor structure fabrication, e.g., for integrated circuit fabrication. In an embodiment, a contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separately patterning of contacts and contact plugs.

In accordance with one or more embodiments described herein, a method of contact formation involves formation of a contact pattern which is perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

FIGS. 1A-1K illustrate cross-sectional views representing various operations in a method of fabricating a semiconductor structure having gate aligned contacts, in accordance with an embodiment of the present invention. FIG. 2 illustrates a cross-sectional view of a semiconductor structure having gate aligned contacts, in accordance with an embodiment of the present invention.

Referring first to FIG. 2, a semiconductor structure includes a plurality of gate structures 134 disposed above an active region 102 of a substrate. For example, the active region may include a diffusion region 104, as depicted in FIG. 2. The gate structures 134 each include a gate dielectric layer 136, a gate electrode 138, and sidewall spacers 110. A dielectric cap 140 may also be included, as described in greater detail below. A plurality of contacts 142 is included, each contact disposed directly between the sidewall spacers 110 of two adjacent gate structures of the plurality of gate structures 134. A plurality of contact plugs 128/132 is also included, each contact plug disposed directly between the sidewall spacers 110 of two adjacent gate structures of the plurality of gate structures. Possible material options for gate structures 134, active region 102, diffusion region 104, gate dielectric layer 136, gate electrode 138, sidewall spacers 110, dielectric cap 140, contacts 142, and contact plugs 128/132 are provided below. Accordingly, in an embodiment, there is no intervening material layer or residue of such disposed between the sidewalls spacers 110 of gate structures 134 and contacts 142.

Figure 2:
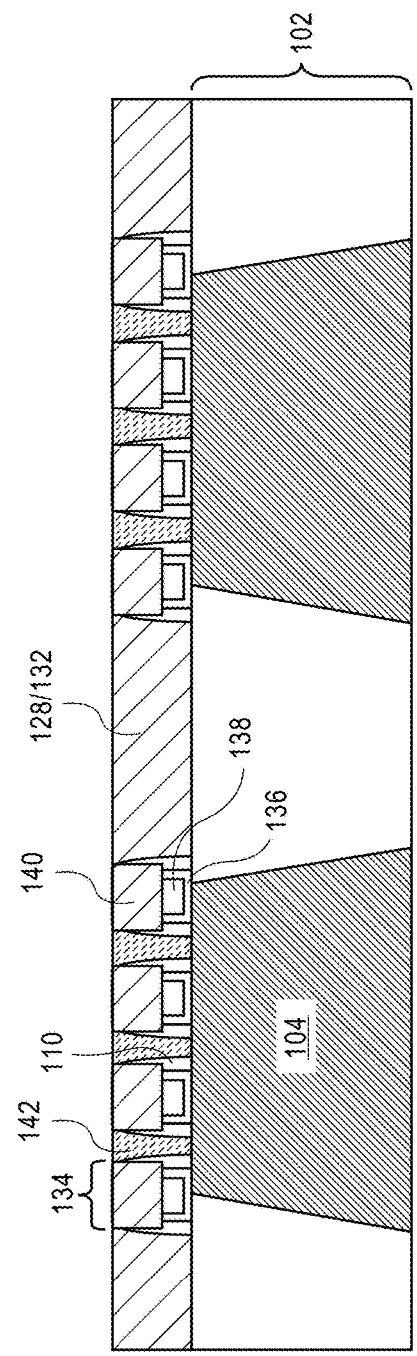
FIG. 2 illustrates a cross-sectional view of a semiconductor structure having gate aligned contacts, in accordance with an embodiment of the present invention.

Referring to FIG. 1A, an initiating point in a method for fabricating a semiconductor structure, such as the structure described in association with FIG. 2, may begin with the fabrication of a gate line grating 106. The gate line grating 106 may include dummy gate 106 with spacers 110. The gate line grating 106 may be formed above an active region 102 and, in some places, above a diffusion region 104 of the active region 102. Thus, in an embodiment, source and drain regions (e.g., region 104) have been fabricated at this stage. A final gate pattern, however, has not been formed yet although the gate grating pattern has been formed. The gate line grating 106 may be composed of nitride pillars or some other sacrificial material, which may be referred to as gate dummy material, as described in greater detail below.

In an embodiment, the active region 102 is composed of a single crystal of a material which may include, but is not limited to, silicon, germanium, silicon-germanium or a III-V compound semiconductor material. Diffusion regions 104 are, in one embodiment, heavily doped regions of active region 102. In one embodiment, active region 102 is composed of a group IV material and one or more portions 104 are doped with boron, arsenic, phosphorus, indium or a combination thereof. In another embodiment, active region 102 is composed of a group III-V material and one or more portions 104 are doped with carbon, silicon, germanium, oxygen, sulfur, selenium or tellurium. In an embodiment, at least a portion of active region 102 is strained. Active regions 102 may be, in an embodiment, a part of, or entirely, a three-dimensional structure, such as a patterned semiconductor body. Alternatively, in another embodiment, active region 102 is globally planar.

Active region 102 may be included as a portion of a broader substrate. The substrate may be composed of a material suitable for semiconductor device fabrication. In an embodiment, the substrate is a bulk substrate. For example, in one embodiment, the substrate is a bulk substrate composed of a single crystal of a material which may include, but is not limited to, silicon, germanium, silicon-germanium or a III-V compound semiconductor material. Alternatively, the substrate includes an upper epitaxial layer and a lower bulk portion, either of which may be composed of a single crystal of a material which may include, but is not limited to, silicon, germanium, silicon-germanium or a III-V compound semiconductor material. An intervening insulator layer composed of a material which may include, but is not limited to, silicon dioxide, silicon nitride or silicon oxynitride may be disposed between the upper epitaxial layer and the lower bulk portion.

The gate line grating 106 may be formed from dummy gates 108. The dummy gates 108 are, in an embodiment, composed of a material suitable for removal at the replacement gate operation, as discussed below. In one embodiment, dummy gates 108 are composed of polycrystalline silicon, amorphous silicon, silicon dioxide, silicon nitride, or a combination thereof. In another embodiment, a protective capping layer (not shown), such as a silicon dioxide or silicon nitride layer, is formed above dummy gates 108. In an embodiment, an underlying dummy gate dielectric layer (also not shown) is included. In an embodiment, dummy gates 108 further include sidewall spacers 110, which may be composed of a material suitable to ultimately electrically isolate a permanent gate structure from adjacent conductive contacts. For example, in one embodiment, the spacers 110 are composed of a dielectric material such as, but not limited to, silicon dioxide, silicon oxy-nitride, silicon nitride, or carbon-doped silicon nitride.

Figure 1B:
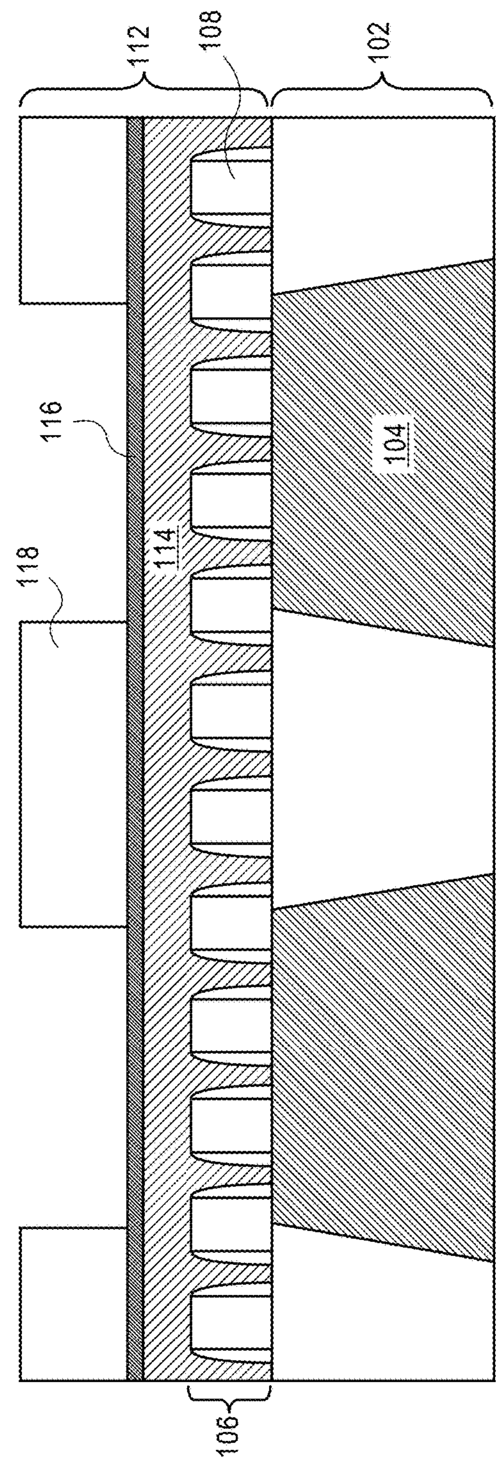

Referring to FIG. 1B, a masking stack 112 is formed above and between the dummy gates 108 of the gate line grating 106. The masking stack 112 includes a hardmask layer 114, and anti-reflective coating (ARC) layer 116, and a patterned photo-resist layer 118. In accordance with an embodiment of the present invention, the photo-resist layer 118 of the masking stack 112 is patterned to ultimately facilitate formation of interruptions in a subsequently formed contact pattern. The interruptions may be referred to as "contact plugs."

In an embodiment, the hardmask layer 114 is composed of a material suitable to act as a subsequent sacrificial layer. For example, in one embodiment, as described in greater detail below, the hardmask layer 114 is ultimately patterned to leave portions remaining which are subsequently removed selective to other features. In a specific such embodiment, hardmask layer 114 is composed substantially of carbon, e.g., as a layer of cross-linked organic polymer. In one embodiment, the hardmask layer 114 is composed of an organic polymer material such as a bottom anti-reflective coating (BARC) layer. In an embodiment, the hardmask layer 114 is formed by a chemical vapor deposition (CVD) process.

In an embodiment, ARC layer 116 is suitable to suppress reflective interference during lithographic patterning of the photo-resist layer 118. In one such embodiment, the ARC layer 116 is composed of a spin-on-glass material. The patterned photo-resist layer 118 may be composed of a material suitable for use in a lithographic process. In one embodiment, the patterned photo-resist layer 118 is formed by first masking a blanket layer of photo-resist material and then exposing it to a light source. The patterned photo-resist layer 118 may then be formed by developing the blanket photo-resist layer. In an embodiment, the portions of the photo-resist layer exposed to the light source are removed upon developing the photo-resist layer. Thus, patterned photo-resist layer 118 is composed of a positive photo-resist material. In a specific embodiment, the patterned photo-resist layer 118 is composed of a positive photo-resist material such as, but not limited to, a 248 nm resist, a 193 nm resist, a 157 nm resist, an extreme ultra violet (EUV) resist, an e-beam imprint layer, or a phenolic resin matrix with a diazonaphthoquinone sensitizer. In another embodiment, the portions of the photo-resist layer exposed to the light source are retained upon developing the photo-resist layer. Thus, patterned photo-resist layer 118 is composed of a negative photo-resist material. In a specific embodiment, the patterned photo-resist layer 118 is composed of a negative photo-resist material such as, but not limited to, consisting of poly-cis-isoprene or poly-vinyl-cinnamate.

Figure 1C:
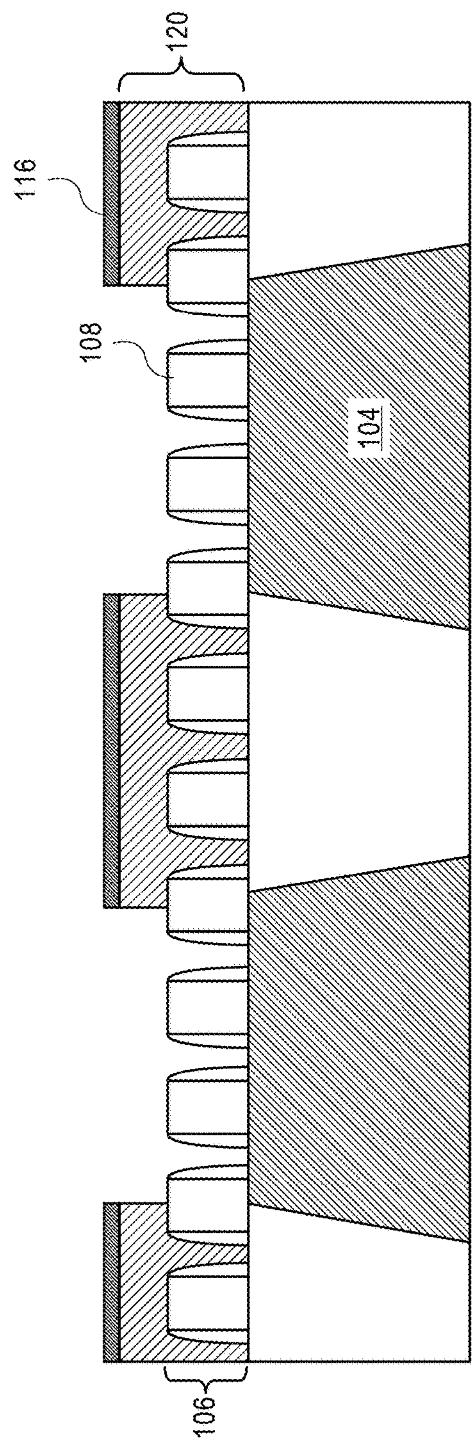

Referring to FIG. 1C, the pattern of the photo-resist layer 118 is transferred to hardmask layer 114 by an etch process to provide a patterned hardmask layer 120 above and between some of the dummy gates 108 of the gate line grating 106. The photo-resist layer 118 is removed. However, a patterned portion of ARC layer 116 may remain, as depicted in FIG. 1C. In accordance with an embodiment of the present invention, the pattern of the photo-resist layer 118 is transferred to hardmask layer 114 to expose the dummy gates 108 overlying the diffusion regions 104, as is also depicted in FIG. 1C. In one such embodiment, the pattern of the photo-resist layer 118 is transferred to hardmask layer 114 by using a plasma etch process.

Figure 1D:
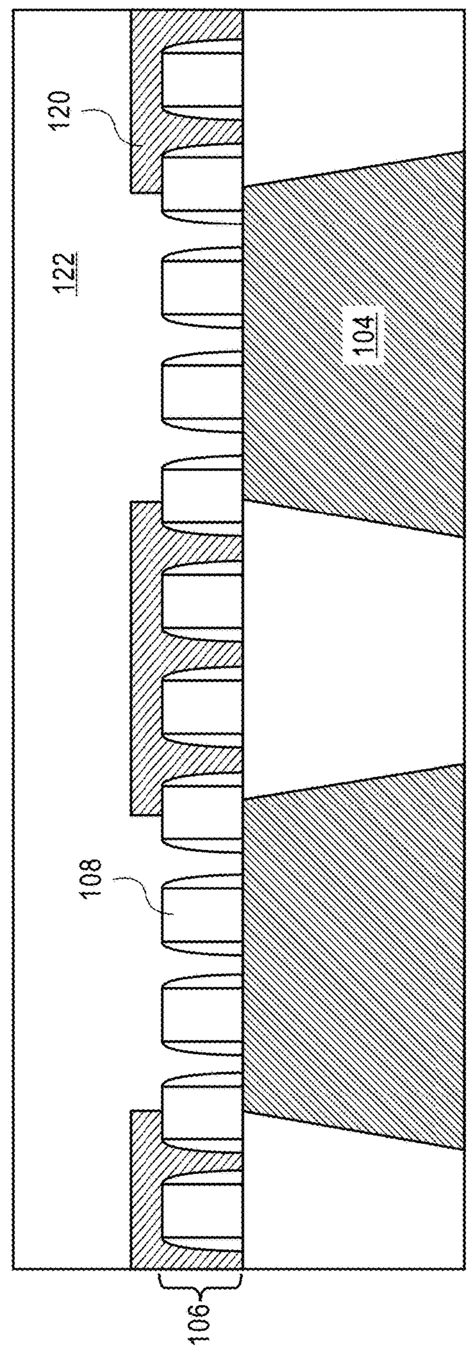

Referring to FIG. 1D, any remaining portions of ARC layer 116 are removed and a dielectric layer 122 is formed above the patterned hardmask layer 120 and above and between the exposed dummy gates 108 of the gate line grating 106. In an embodiment, the dielectric layer 122 is composed of a material suitable to act as a subsequent sacrificial layer. For example, in one embodiment, as described in greater detail below, the dielectric layer 122 is ultimately removed selective to other exposed features. In a specific embodiment, the dielectric layer is composed of silicon dioxide.

Figure 1E:
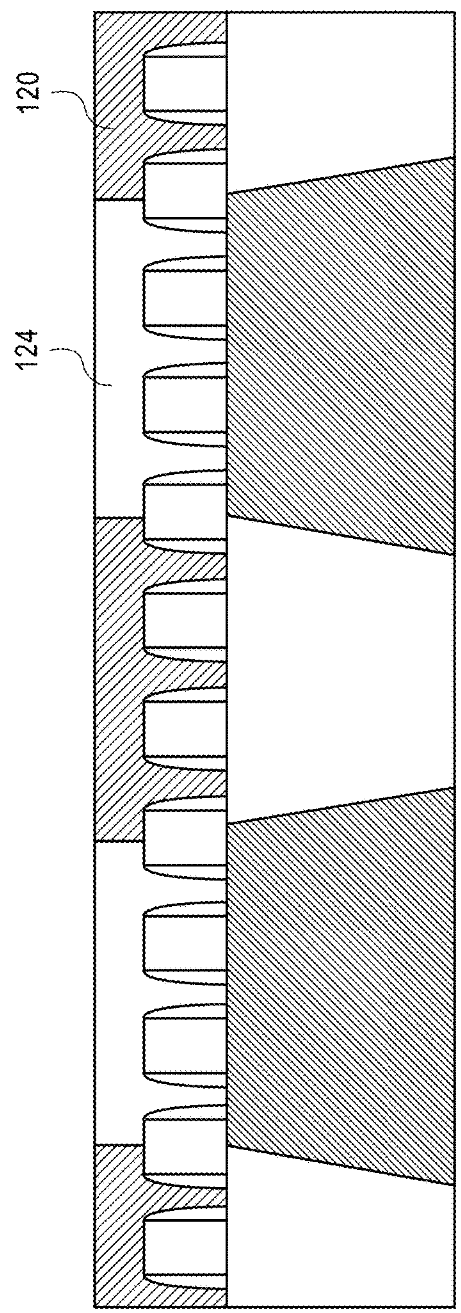

Referring to FIG. 1E, the dielectric layer 122 is planarized to form patterned dielectric layer 124 and to re-expose the patterned hardmask layer 120. In an embodiment, the dielectric layer 122 is planarized by a chemical mechanical planarization (CMP) process operation. In one such embodiment, the CMP process operation involves polishing the dielectric layer 122 on a polishing pad using a slurry. In another embodiment, a dry etch process is used.

Figure 1F:
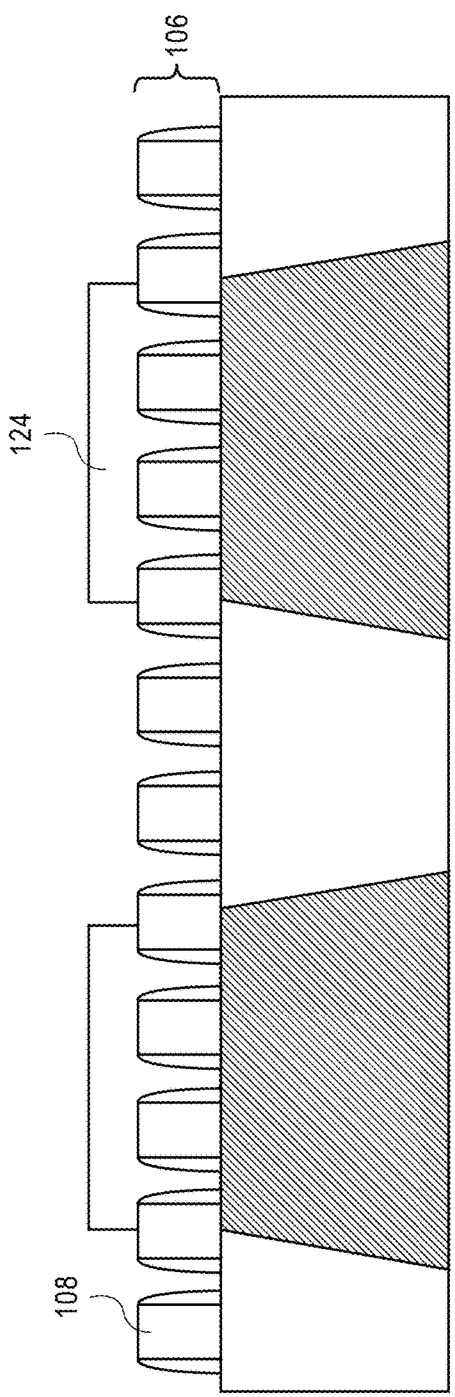

Referring to FIG. 1F, the patterned hardmask layer 120 is removed with selectivity to the patterned dielectric layer 124, and with selectivity to any underlying dummy gates 108 of the gate line grating 106. In an embodiment, the patterned hardmask layer 120 is composed substantially, or entirely, or carbon and is removed with selectivity to a patterned dielectric layer 124 composed of silicon dioxide. In an embodiment, the patterned hardmask layer 120 is composed substantially, or entirely, or carbon and is removed with an ash process. In one embodiment, the patterned hardmask layer 120 is composed of carbon-containing species and is removed in a dry ash operation utilizing oxygen ($O_2$) gas or a combination of nitrogen ($N_2$) gas and hydrogen ($H_2$) gas.

Figure 1G:
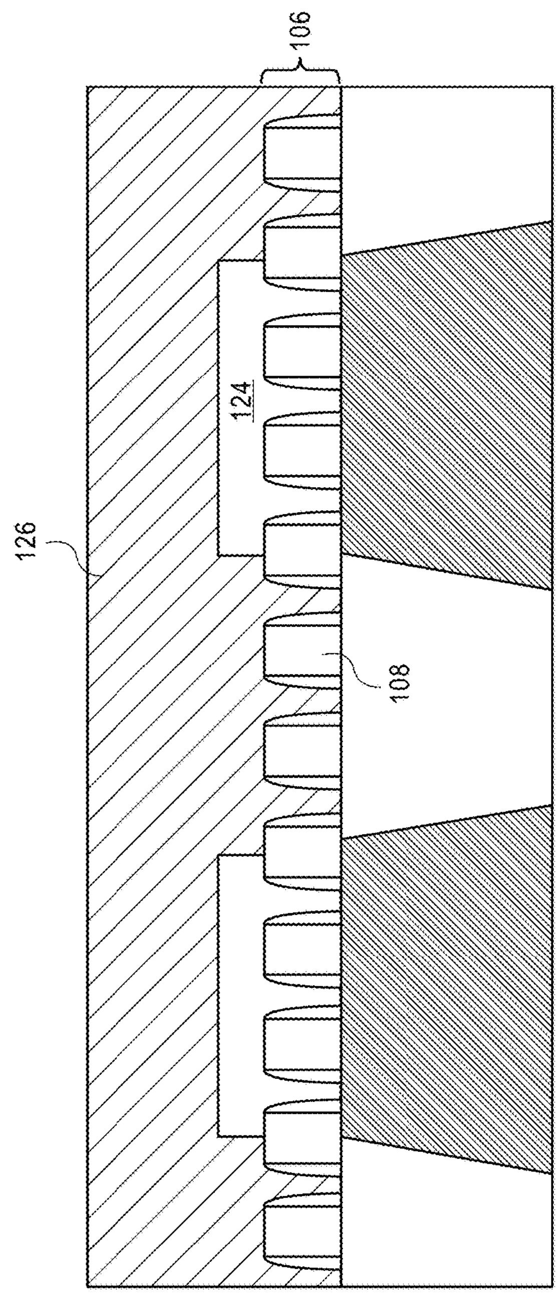

Referring to FIG. 1G, an interlayer dielectric layer 126 is formed above the patterned dielectric layer 124 and above and between the exposed dummy gates 108 of the gate line grating 106. In accordance with an embodiment of the present invention, the interlayer dielectric layer 126 provides a first portion of a permanent interlayer dielectric layer, as described below. In one embodiment, the interlayer dielectric layer 126 is composed of a silicon carbide material. In a specific such embodiment, the silicon carbide material is formed using a chemical vapor deposition (CVD) process. In another embodiment, the interlayer dielectric layer 126 is composed of a material such as, but not limited to, silicon dioxide, silicon nitride, or silicon oxynitride.

Figure 1H:
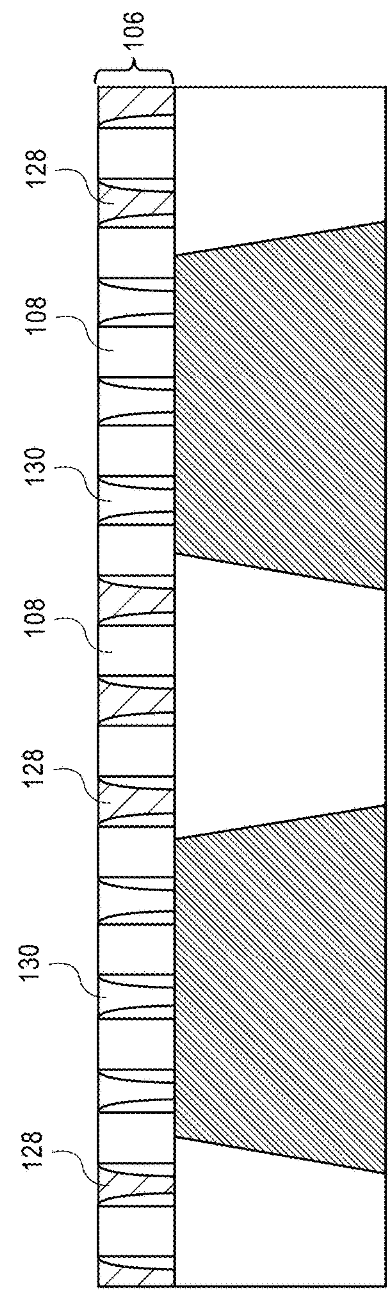

Referring to FIG. 1H, the interlayer dielectric layer 126 and the patterned dielectric layer 124 are planarized to expose the top portions of all dummy gates 108 of the gate line grating 106. In accordance with an embodiment of the present invention, the planarizing provides a first permanent interlayer dielectric portion 128 and a sacrificial dielectric portion 130. In an embodiment, the interlayer dielectric layer 126 and the patterned dielectric layer 124 are planarized by a CMP process operation, as described above in association with FIG. 1E.

Figure 1I:
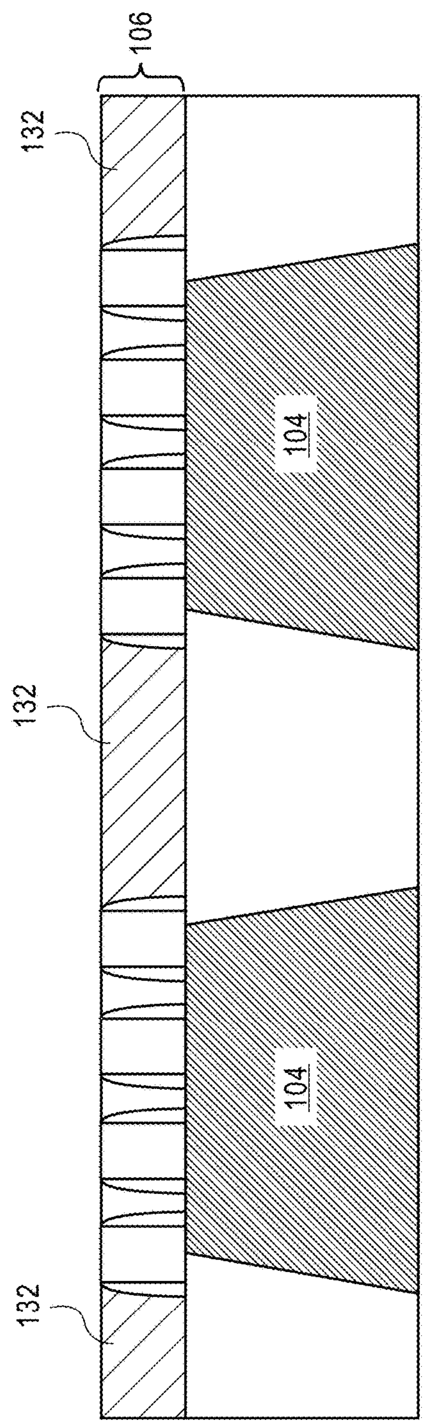

At this stage, the dummy gates 108, including the spacers 110, of the gate line grating 106 may be patterned orthogonal to the grating structure. As an example, portions of the gate line grating 106 that are not over a diffusion area, e.g., over an isolation region, may be removed. In another example, the patterning yields discrete dummy gate structures. Referring to FIG. 1I, in one such embodiment, the portions of the dummy gates 108 (and corresponding spacer 110 portions) not overlying diffusion regions 104 are removed, e.g., by a lithography and etch process.

Referring again to FIG. 1I, the regions where portions of the gate line grating 106 are removed may then be filled by a second permanent interlayer dielectric portion 132. The second permanent interlayer dielectric portion 132 may be formed in a manner similar to, and from the same or like material as, the first permanent interlayer dielectric portion 128, e.g., by deposition and planarization. It is to be understood that the view in FIG. 1I may be of a cross-section in a location different (e.g., into or out of the page) than the cross-section illustrated in FIG. 1H. Thus, at this point, a permanent interlayer dielectric layer may be defined by the combination of the first permanent interlayer dielectric portion 128 formed in first regions (not shown in FIG. 1I) and the second permanent interlayer dielectric portion 132 formed in second regions. In one such embodiment, both the first permanent interlayer dielectric portion 128 and the second permanent interlayer dielectric portion 132 are composed of silicon carbide.

At this stage, the exposed remaining dummy gates 108 may be replaced in a replacement gate process scheme. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing.

In an embodiment, dummy gates 108 are removed by a dry etch or wet etch process. In one embodiment, dummy gates 108 are composed of polycrystalline silicon or amorphous silicon and are removed with a dry etch process comprising $SF_6$. In another embodiment, dummy gates 108 are composed of polycrystalline silicon or amorphous silicon and are removed with a wet etch process comprising aqueous $NH_4OH$ or tetramethylammonium hydroxide. In one embodiment, dummy gates 108 are composed of silicon nitride and are removed with a wet etch comprising aqueous phosphoric acid.

Figure 1J:
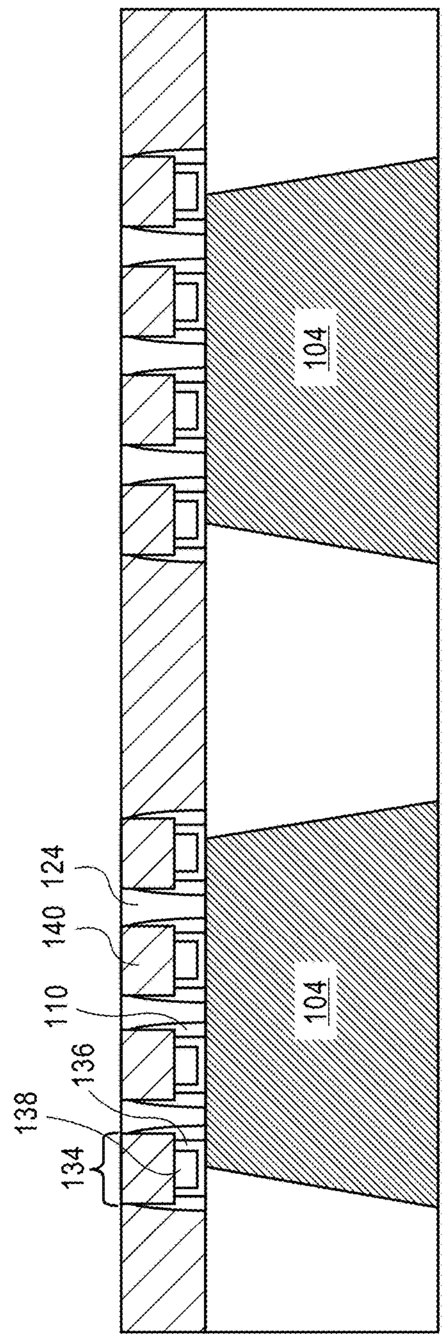

Referring to FIG. 1J, permanent gate structures 134 are formed to include a permanent gate dielectric layer 136 and a permanent gate electrode layer or stack 138. Additionally, in an embodiment, a top portion of the permanent gate structures 134 are removed, e.g., by an etch process, and replaced with a dielectric cap layer 140. In an embodiment, the dielectric cap layer 140 is composed of the same material as both the first permanent interlayer dielectric portion 128 and the second permanent interlayer dielectric portion 132 are composed of silicon carbide. In one such embodiment, all of the dielectric cap layer 140, the first permanent interlayer dielectric portion 128, and the second permanent interlayer dielectric portion 132 are composed of silicon carbide.

In an embodiment, the permanent gate dielectric layer 136 is composed of a high-K material. For example, in one embodiment, the permanent gate dielectric layer 136 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of the permanent gate dielectric layer 136 may include a layer of native oxide formed from the top few layers of the diffusion region 104. In an embodiment, the permanent gate dielectric layer 136 is composed of a top high-k portion and a lower portion composed of an oxide of a semiconductor material. In one embodiment, the permanent gate dielectric layer 136 is composed of a top portion of hafnium oxide and a bottom portion of silicon dioxide or silicon oxy-nitride.

In an embodiment, the permanent gate electrode layer or stack 138 is composed of a metal gate. In one embodiment, the permanent gate electrode layer or stack 138 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the permanent gate electrode layer or stack 138 is composed of a non-workfunction-setting fill material formed above a metal workfunction-setting layer. In an embodiment, the permanent gate electrode layer or stack 138 also includes sidewall spacers 110 which may be composed of an insulative dielectric material, as described above.

Figure 1K:
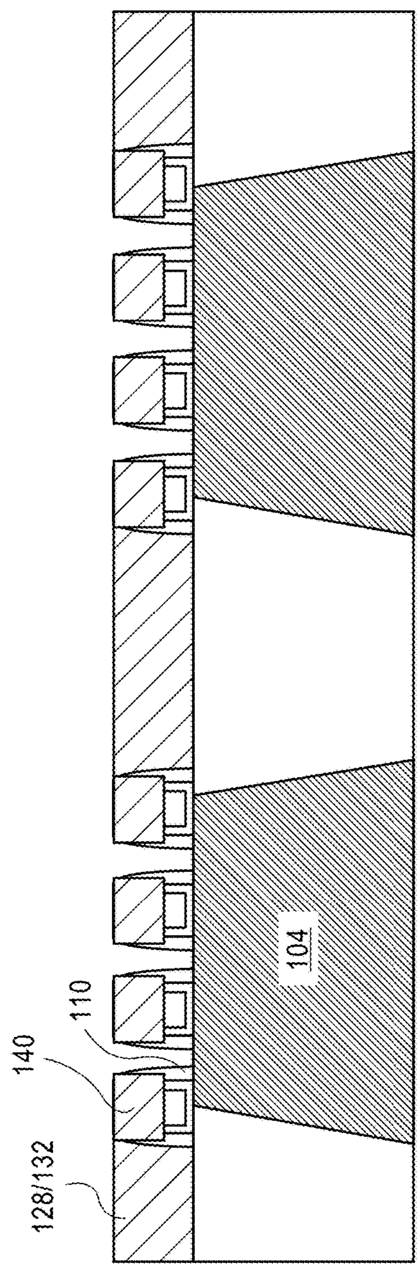

Referring to FIG. 1K, the sacrificial dielectric portion 130 is removed selective to the dielectric cap layer 140, the first permanent interlayer dielectric portion 128, the second permanent interlayer dielectric portion 132, the spacers 110, and the exposed portions of the diffusion regions 104. In an embodiment, the sacrificial dielectric portion 130 is removed with a dry etch or wet etch process, e.g., an aqueous hydrofluoric acid (HF) wet etch process. In accordance with an embodiment of the present invention, the sacrificial dielectric portion 130 acts as a sacrificial placeholder for subsequent contact formation.

Referring again to FIG. 2, contacts 142 are formed the sacrificial dielectric portion 130 once resided. Thus, the contacts 142 are formed between the permanent gate structures 134. In an embodiment, the contacts 142 are formed by deposition and planarization, e.g., by CMP, of a conductive material. Contacts 142 may be composed of a conductive material. In an embodiment, contacts 142 are composed of a metal species. The metal species may be a pure metal, such as nickel or cobalt, or may be an alloy such as a metal-metal alloy or a metal-semiconductor alloy (e.g., such as a silicide material).

Figure 3:
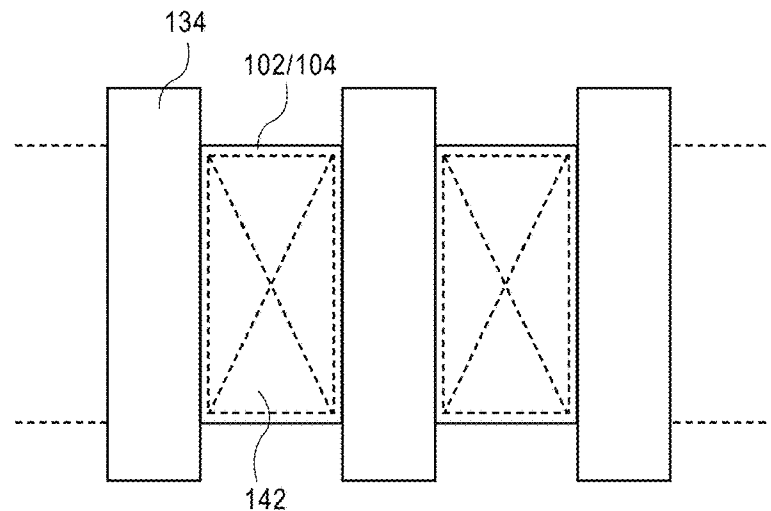
FIG. 3 illustrates a plan view of a semiconductor structure having gate aligned contacts, in accordance with an embodiment of the present invention.

FIG. 3 illustrates a plan view showing certain features of the semiconductor structure of FIG. 2, in accordance with an embodiment of the present invention. Referring to FIG. 3, a semiconductor structure includes a plurality of gate structures 134 disposed above an active region 102, such as a diffusion region 104, of a substrate. A plurality of contacts 142 is included, each contact disposed directly between two adjacent gate structures of the plurality of gate structures 134, e.g., directly between the sidewall spacers of two adjacent gate structures of the plurality of gate structures 134.

Accordingly, in an embodiment, a method of fabricating a semiconductor structure includes forming a gate line grating above a substrate. The gate line grating includes a plurality of dummy gate lines. A masking stack is formed above and between the dummy gate lines of the gate line grating. A patterned hardmask layer is formed from the masking stack above and between only a first portion of the dummy gate lines of the gate line grating, exposing a second portion of the dummy gate lines. A dielectric layer is formed above the patterned hardmask layer and above and between the second portion of the dummy gate lines. The dielectric layer is planarized to form a patterned dielectric layer above and between the second portion of the dummy gate lines, and to re-expose the patterned hardmask layer. The patterned hardmask layer is removed from the first portion of the dummy gate lines of the gate line grating, re-exposing the first portion of the dummy gate lines. An interlayer dielectric layer is formed above the patterned dielectric layer, and above and between the first portion of the dummy gate lines. The interlayer dielectric layer and the patterned dielectric layer are planarized to, respectively, form a first permanent interlayer dielectric portion between but not above the first portion of the dummy gate lines, and form a sacrificial dielectric portion between but not above the second portion of the dummy gate lines. One or more of the dummy gate lines of the first or second portions, or both, of the dummy gate lines is patterned to provide trench regions among a plurality of dummy gates and among remaining regions of the first permanent interlayer dielectric portion and the sacrificial dielectric portion. The trench regions are filled with a second permanent interlayer dielectric portion. The plurality of dummy gates is replaced with permanent gate structures. The remaining region of the sacrificial dielectric portion is removed to provide contact openings. Contacts are then formed in the contact openings.

In one such embodiment, forming the patterned hardmask layer includes forming a cross-linked organic polymer layer, forming the dielectric layer includes forming a layer of silicon dioxide, forming the interlayer dielectric layer includes forming a layer of silicon carbide, and filling the trench regions with a second permanent interlayer dielectric portion includes forming and planarizing a second layer of silicon carbide. In a specific such embodiment, replacing the plurality of dummy gates with permanent gate structures includes forming a permanent gate dielectric layer, a permanent gate layer, and a silicon carbide cap layer. In another such embodiment, forming the gate line grating above the substrate includes forming the dummy gate lines above a top surface of, and along sidewalls of, a three-dimensional active region.

In an embodiment, one or more approaches described herein contemplate effectively a dummy and replacement gate process in combination with a dummy and replacement contact process. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In an embodiment, dummy contacts are formed prior to the formation of contact plugs. That is, the dummy contacts may be formed prior to cutting dummy gate structures in a gate grating. Such an approach may provide flexibility in ultimate layout. In one such embodiment, a contact structure is formed in contact with two or more diffusion regions. For example, FIG. 4 illustrates a plan view of another semiconductor structure having gate aligned contacts, in accordance with another embodiment of the present invention.

Figure 4:
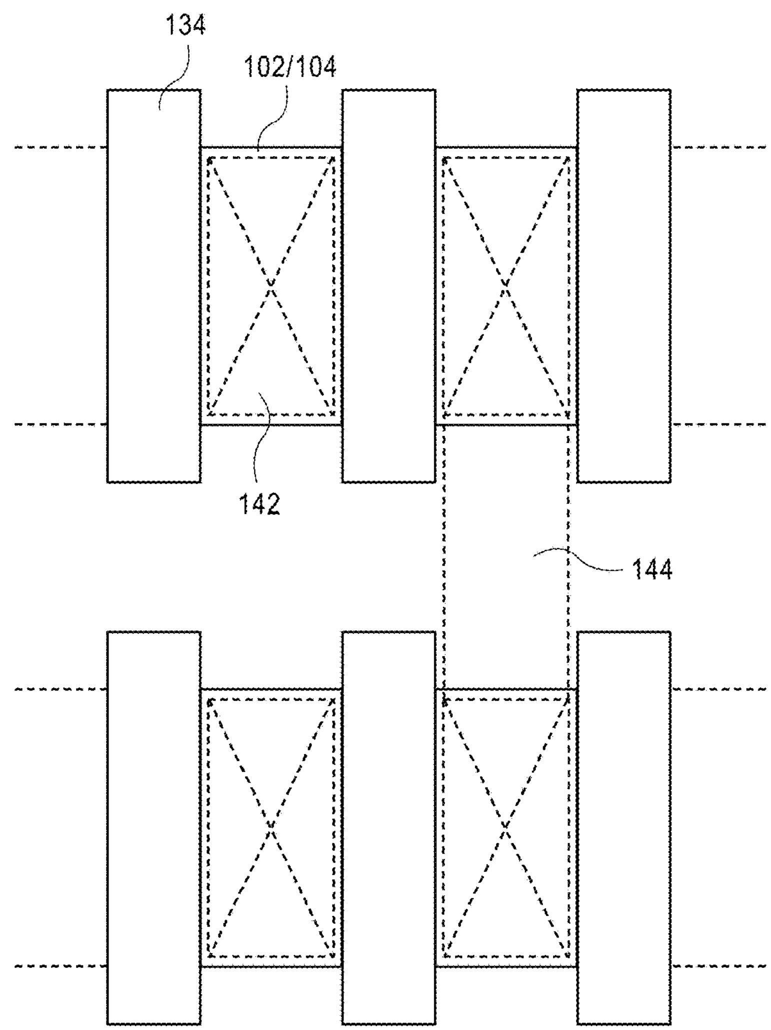
FIG. 4 illustrates a plan view of another semiconductor structure having gate aligned contacts, in accordance with another embodiment of the present invention.

Referring to FIG. 4, a semiconductor structure includes a plurality of gate structures 134 disposed above an active region 102, such as a diffusion region 104, of a substrate. A plurality of contacts 142 is included, each contact disposed directly between two adjacent gate structures of the plurality of gate structures 134, e.g., directly between the sidewall spacers of two adjacent gate structures of the plurality of gate structures 134. One of the contacts 144 is formed in contact with two diffusion regions. The formation of the contact 144 is, in a specific embodiment, facilitated by the previous presence of dummy gate grating lines that are not cut until at least a dummy contact placeholder for contact 144 is formed.

It is to be understood that not all aspects of the processes described above need be practiced to fall within the spirit and scope of embodiments of the present invention. For example, in one embodiment, dummy gates need not ever be formed. The gate stacks described above may actually be permanent gate stacks as initially formed. In one such embodiment, so long as plug formation is followed by gate cut operations, benefits and advantages will be realized.

The processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET.

Figure 5:
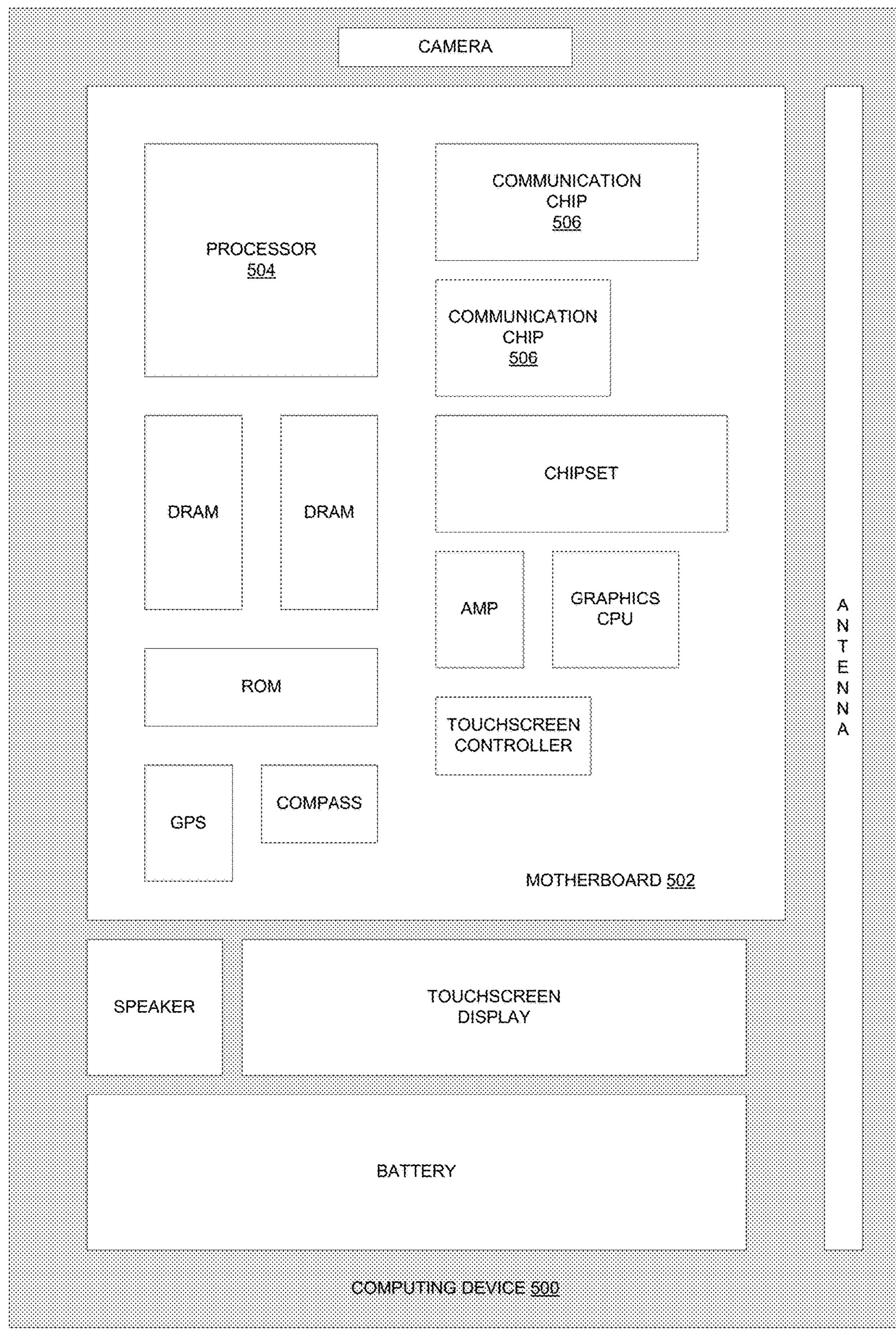
FIG. 5 illustrates a computing device in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Thus, gate aligned contacts and methods of forming gate aligned contacts have been disclosed. In an embodiment, a method of fabricating a semiconductor structure includes forming a plurality of gate structures above an active region formed above a substrate. The gate structures each include a gate dielectric layer, a gate electrode, and sidewall spacers. A plurality of contact plugs is formed, each contact plug formed directly between the sidewall spacers of two adjacent gate structures of the plurality of gate structures. A plurality of contacts is formed, each contact formed directly between the sidewall spacers of two adjacent gate structures of the plurality of gate structures. The plurality of contacts and the plurality of gate structures are formed subsequent to forming the plurality of contact plugs. In one embodiment, the plurality of gate structures is formed by replacing a plurality of dummy gates prior to forming the plurality of contacts. In one embodiment, forming the plurality of contacts includes forming a contact structure in contact with two or more diffusion regions of the active region.

What is claimed is:

1. An integrated circuit structure, comprising:

a first silicon body having a longest dimension along a first direction;

a second silicon body having a longest dimension along the first direction;

a first gate line over the first silicon body and over the second silicon body along a second direction, the second direction orthogonal to the first direction, wherein the first gate line has a first discontinuity between the first silicon body and the second silicon body;

a second gate line over the first silicon body and over the second silicon body along the second direction, wherein the second gate line has a second discontinuity between the first silicon body and the second silicon body, the second discontinuity laterally adjacent to the first discontinuity, and wherein each of the first gate line and the second gate line comprises a high-k gate dielectric layer, a gate electrode, and a dielectric cap layer;

a trench contact line over the first silicon body and over the second silicon body along the second direction, the trench contact between the first gate line and the second gate line, wherein the trench contact is continuous between the first silicon body and the second silicon body at a location laterally adjacent to the first discontinuity and the second discontinuity;

a first dielectric spacer laterally between the trench contact and the first gate line; and a second dielectric spacer laterally between the trench contact and the second gate line.

2. The integrated circuit structure of claim 1, wherein the trench contact is directly adjacent to and in contact with the first dielectric spacer and the second dielectric spacer.

3. The integrated circuit structure of claim 1, wherein the trench contact has an uppermost surface substantially co-planar with an uppermost surface of the dielectric cap layer.

4. The integrated circuit structure of claim 1, wherein the first dielectric spacer and the second dielectric spacer comprise silicon and nitrogen.

5. The integrated circuit structure of claim 1, wherein the high-k gate dielectric layer comprises hafnium and oxygen.

6. The integrated circuit structure of claim 1, wherein the gate electrode comprises a metal.

7. An integrated circuit structure, comprising:

a plurality of gate structures over a three-dimensional semiconductor body of a substrate, each of the plurality of gate structures comprising a gate dielectric layer, a gate electrode, sidewall spacers, and a dielectric cap layer between and laterally adjacent to the sidewall spacers;

a plurality of contacts, each of the plurality of contacts directly between the sidewall spacers of two adjacent gate structures of the plurality of gate structures, and each of the plurality of contacts having a top surface substantially co-planar with a top surface of the dielectric cap layer of the plurality of gate structures, and each of the plurality of contacts having a bottom surface substantially co-planar with a bottom surface of the plurality of gate structures, wherein the plurality of contacts comprises first and second immediately neighboring contacts both continuous between a first end and a second end, the first end at a first same location along a length of the plurality of gate structures orthogonal to a longest length of the three-dimensional semiconductor body, and the second end at a second same location along the length of the plurality of gate structures orthogonal to the longest length of the three-dimensional semiconductor body; and a plurality of contact plugs, each of the plurality of contact plugs directly between the sidewall spacers of two adjacent gate structures of the plurality of gate structures, and each of the plurality of contact plugs having a top surface substantially co-planar with the top surface of the dielectric cap layer of the plurality of gate structures, and substantially co-planar with the top surface of the plurality of contacts.

8. The integrated circuit structure of claim 7, wherein the plurality of contacts comprises a conductive material, and the plurality of contact plugs comprises silicon carbide.

9. The integrated circuit structure of claim 8, wherein each of the plurality of gate structures comprises a high-K gate dielectric, a metal gate, and a silicon carbide cap as a dielectric material of the dielectric cap layer.

10. The integrated circuit structure of claim 7, wherein one of the plurality of contacts is in contact with two or more diffusion regions of the three-dimensional semiconductor body.

11. The integrated circuit structure of claim 7, wherein each of the plurality of gate structures comprises a high-K gate dielectric, a metal gate, and a silicon carbide cap as a dielectric material of the dielectric cap layer.

12. The integrated circuit structure of claim 7, wherein the sidewall spacers comprise a material selected from the group consisting of silicon dioxide, silicon oxy-nitride, silicon nitride and carbon-doped silicon nitride.

13. The integrated circuit structure of claim 12, wherein dielectric cap layer comprises silicon carbide.

14. An integrated circuit structure, comprising:

a plurality of gate structures above a semiconductor body of a substrate, each of the plurality of gate structures comprising a gate dielectric layer, a gate electrode, sidewall spacers, and a dielectric cap layer between and laterally adjacent to the sidewall spacers;

a plurality of contacts, each of the plurality of contacts directly between the sidewall spacers of two adjacent gate structures of the plurality of gate structures, and each of the plurality of contacts having a top surface substantially co-planar with a top surface of the dielectric cap layer of the plurality of gate structures, and each of the plurality of contacts having a bottom surface substantially co-planar with a bottom surface of the plurality of gate structures, wherein the plurality of contacts comprises first and second immediately neighboring contacts both continuous between a first end and a second end, the first end at a first same location along a length of the plurality of gate structures orthogonal to a longest length of the semiconductor body, and the second end at a second same location along the length of the plurality of gate structures orthogonal to the longest length of the semiconductor body; and a plurality of contact plugs, each of the plurality of contact plugs directly between the sidewall spacers of two adjacent gate structures of the plurality of gate structures, and each of the plurality of contact plugs having a top surface substantially co-planar with the top surface of the dielectric cap layer of the plurality of gate structures, and substantially co-planar with the top surface of the plurality of contacts.

15. The integrated circuit structure of claim 14, wherein the plurality of contacts comprises a conductive material, and the plurality of contact plugs comprises silicon carbide.

16. The integrated circuit structure of claim 15, wherein each of the plurality of gate structures comprises a high-K gate dielectric, a metal gate, and a silicon carbide cap as a dielectric material of the dielectric cap layer.

17. The integrated circuit structure of claim 14, wherein one of the plurality of contacts is in contact with two or more diffusion regions of the semiconductor body of the substrate.

18. The integrated circuit structure of claim 14, wherein each of the plurality of gate structures comprises a high-K gate dielectric, a metal gate, and a silicon carbide cap as a dielectric material of the dielectric cap layer.

19. The integrated circuit structure of claim 14, wherein the sidewall spacers comprise a material selected from the group consisting of silicon dioxide, silicon oxy-nitride, silicon nitride and carbon-doped silicon nitride.

20. The integrated circuit structure of claim 19, wherein dielectric cap layer comprises silicon carbide.

* * * * *